United States Patent

[11] 3,582,673

[72] Inventors Kenneth Hubert Clayson;
Anthony Waddington-Morris, both of Birmingham, England
[21] Appl. No. 771,722
[22] Filed Oct. 30, 1968
[45] Patented June 1, 1971
[73] Assignee Wilmot-Breeden Limited
Birmingham, England

[54] INTERFERENCE-FREE MULTIVIBRATOR SWITCHING CIRCUIT USING SATURATED UNDOPED TRANSISTORS WITH LARGE BASE-TO-EMITTER CAPACITY
3 Claims, 1 Drawing Fig.

[52] U.S. Cl. 307/202, 307/272, 307/280, 307/292, 307/300
[51] Int. Cl. H02h 7/20
[50] Field of Search 307/272, 273, 276, 280, 289, 290, 291, 292, 300, 202

[56] References Cited

UNITED STATES PATENTS

| | | | |
|---|---|---|---|
| 2,974,238 | 3/1961 | Lohmon | 307/292X |
| 3,241,017 | 3/1966 | Madsen et al. | 307/292X |
| 3,345,521 | 10/1967 | Leenhoutz | 307/292X |

OTHER REFERENCES

Hurley, R. B., " Transistor Electronics," John Wiley & Sons, N. Y. (pgs. 363— 367) (1958).

*Primary Examiner*—Donald D. Forrer
*Assistant Examiner*—R. C. Woodbridge
*Attorney*—Watson, Cole Grindle & Watson

ABSTRACT: In a multivibrator-type switching circuit using transistors which are switched from a cutoff to a saturation condition, the base circuit of each transistor is arranged to supply to the base of the transistor, when the latter is in a saturated condition, a current which is at least five times, typically between five and 10 times, the maximum collector current of the transistor divided by the minimum common emitter current gain. By using this base current, which is far above that normally employed in this type of circuit, the charge on the base-to-emitter capacity is increased thereby requiring considerably higher energy to cause malfunction. The circuit is thus much less susceptible to misoperation due to interferring signals than prior types of circuits.

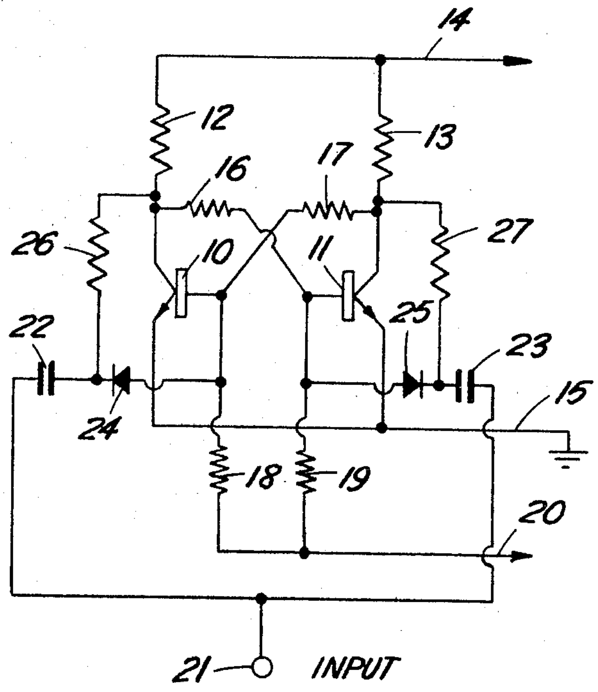
Inventors
Kenneth Herbert Clayson
Anthony Waddington-Morris
BY
Watson, Cole, Grindle & Watson
Attorneys

INTERFERENCE-FREE MULTIVIBRATOR SWITCHING CIRCUIT USING SATURATED UNDOPED TRANSISTORS WITH LARGE BASE-TO-EMITTER CAPACITY

BACKGROUND OF THE INVENTION

1. Field of the Invention

This invention relates to multivibrator-type switching circuits. The expression multivibrator-type circuits is to be understood to include bistable, monostable and astable circuits.

2. Description of the Prior Art

Multivibrator-type switching circuits are commonly used, inter alia, in logic circuits for control apparatus. Nowadays transistors are usually employed in the construction of bistable and other multivibrator-type switching circuits. Particularly with apparatus for the control of machine tools and the like, there are liable to be strong electrical interferring fields and one of the problems met with in such control apparatus is the inadvertent switching of the multivibrator-type logic circuits due to such interference. It is one of the objects of the present invention to provide an improved form of multivibrator-type circuits reducing the risk of inadvertent switching due to interference.

SUMMARY OF THE INVENTION

According to this invention, in a multivibrator-type switching circuit using transistors which are switched from a cutoff to a saturation condition, the base circuit of each transistor is arranged to supply to the base of the transistor, when the latter is in a saturated condition, a current which is at least five times the maximum collector current of the transistor divided by the minimum common emitter current gain. Typically the base current in each transistor, when this transistor is in a saturated condition, would be made between five and 10 times the maximum collector current divided by the minimum common emitter current gain.

The object of increasing the base current far above that normally employed in this type of circuit is to increase the charge on the base to emitter capacity of the transistor. The transistor is preferably chosen to be of a type having a large base to emitter capacity when in saturation and which is not doped to cause the charge in this capacity to leak away internally. With this arrangement the major part of the saturated base to emitter charge for each transistor has to flow out of the base lead of the transistor. Thus, with the increased charge due to the higher base current, a considerably higher energy in the millicoulomb range is required to cause malfunction of the circuit. The circuit is thereby very much less susceptible to misoperation due to interferring signals than prior circuits which have been designed in the orthodox way to have a maximum base current equal to the maximum collector current divided by the minimum common emitter current gain and using conventional transistors which are doped to cause internal dissipation of any charge in the emitter-to-base capacity.

Transistors for switching circuits are normally designed nowadays so that, on removing the base saturation signal, the base to emitter charge is dispersed internally in the transistor with only a small amount of charge flowing out of the base lead. This is done to decrease the saturation time constant $T_s$ (which is defined as the ratio of the saturation base charge to the saturation base current). To improve the high frequency performance of transistors, this saturation time constant has to be kept to a minimum. For many control purposes however, high frequency performance is not important and, for the purposes of the present invention, it is preferable that the charge on the base-to-emitter capacity should have to flow out through the base lead of the transistor and not be dissipated internally in the transistor. Thus, as previously mentioned, for the purposes of the present invention, one preferably uses a transistor with a large base to emitter capacity and which is not doped to cause this charge to leak away internally. In practice, the transistor used should, under forced bias saturation conditions, have a $T_s$ in the region of 1 microsecond or more. The higher the $T_s$ value, and more immune to interference the circuit becomes. Therefore 1 microsecond is a compromise between immunity from interference and speed of switching.

The circuit of the present invention is conveniently formed as an integrated circuit, the whole of the circuit being formed on a single semiconductor chip or substrate.

BRIEF DESCRIPTION OF THE DRAWING

The accompanying drawing is a circuit diagram of a bistable circuit forming one embodiment of the invention.

DESCRIPTION OF THE PREFERRED EMBODIMENT

The circuit shown in the drawing employs two transistors 10, 11 which are of the type described above having high base to emitter capacity when in saturation and which are not doped to cause internal leakage of the base to emitter charge. The collectors of the transistors 10, 11 are connected respectively by resistors 12, 13 to a first supply line 14 and the emitters are connected to earth at 15. The collector of the transistor 10 is connected to the base of the transistor 11 by a resistor 16 and the collector of transistor 11 is connected to the base of the transistor 10 by a resistor 17. The bases of the transistors 10, 11 are connected by resistors 18, 19 respectively to a supply line 20. Input signals at an input 21 are applied to the bases of the two transistors through capacitors 22, 23 and rectifiers 24, 25. The collector of the transistor 10 is connected to the junction between the capacitor 22 and rectifier 24 by a resistor 26 and the collector of transistor 11 is connected to the junction between the capacitor 23 and rectifier 25 by a resistor 27.

The potentiometer networks feeding the bases of the transistors 10, 11 are formed by the resistors 13, 17 and 18, and 12, 16 and 19 respectively and these networks are arranged so that the base current fed into each transistor, when it is in the on condition, is between five and 10 times the maximum collector current divided by the minimum common emitter current gain. For this purpose the total resistance of each of these potentiometer networks is therefore considerably lower than is used in conventional practice where the maximum base current is commonly made equal to the maximum collector current divided by the minimum common emitter current gain.

As previously indicated the circuit may be formed as an integrated circuit on a single germanium or silicon chip or substrate.

We claim:

1. In a multivibrator-type switching circuit using two transistors with interconnecting circuit means operative to switch the transistors alternately from a cutoff to a saturation condition, the improvement comprising the provisions of a base circuit for each transistor arranged to supply to the base of each transistor in a saturated condition a base current at least five times the maximum collector current of the transistor when saturated divided by the minimum physically realizable common emitter current gain of the transistor, said transistors being of a type having a large base-to-emitter capacitance during saturation conditions and an absence of doping in the base-to-emitter region whereby the major part of the saturated base-to-emitter charge for each transistor flows out of the base lead of the transistor.

2. A multivibrator-type switching circuit as claimed in claim 1 wherein the transistors have a saturation time constant of at least 1 microsecond.

3. A multivibrator-type switching circuit comprising first and second transistors, each having an emitter, a collector and a base, said transistors are undoped in the base-to-emitter region, a direct voltage supply having first and second terminals, two collector loads in series respectively with the collectors of the transistors between the collectors and said first terminal, first and second resistors connecting respectively the collectors of the first transistor to the base of the second transistor and the collector of the second transistor to the base of the first transistor, third and fourth resistors connecting the bases of the first and second transistors respectively to said second terminal, a connection between the emitters of the two transistors and ground, a fifth resistor in series with a first rectifier between the collector and the base of the first transistor, a sixth resistor in series with a second rectifier between the collector and base of the second transistor, and an input circuit capacitively connected to the junction of the fifth resistor and first rectifier and the junction of the sixth resistor and second rectifier, said transistors having a saturation time constant of at least 1 microsecond and having a large base to emitter capacity when in saturation, and the loads and first, second, third and fourth resistors being arranged so that the base current fed into each transistor, when it is in the saturated condition, is between five and 10 times the maximum collector current divided by the minimum common emitter current gain.